United States Patent [19]
Kaveh et al.

[11] Patent Number: 5,961,724
[45] Date of Patent: Oct. 5, 1999

[54] TECHNIQUES FOR REDUCING PARTICULATE CONTAMINATION ON A SUBSTRATE DURING PROCESSING

[75] Inventors: Farro Kaveh, Palo Alto; Brett C. Richardson, San Ramon, both of Calif.

[73] Assignee: LAM Research Corporation, Fremont, Calif.

[21] Appl. No.: 09/052,522

[22] Filed: Mar. 30, 1998

[51] Int. Cl.$^6$ ................................................. C23G 16/00
[52] U.S. Cl. ............................................. 118/715; 156/345
[58] Field of Search ............................. 118/715; 156/345

[56] References Cited

U.S. PATENT DOCUMENTS

| | | | |
|---|---|---|---|
| 4,976,996 | 12/1990 | Monkowski | 427/255.5 |
| 5,405,444 | 4/1995 | Moslehi | 118/725 |
| 5,516,367 | 5/1996 | Lei | 118/725 |
| 5,743,967 | 4/1998 | Kobori | 118/724 |

*Primary Examiner*—R. Bruce Breneman
*Assistant Examiner*—Erin Fieler
*Attorney, Agent, or Firm*—Beyer & Weaver, LLP

[57] ABSTRACT

A substrate processing system configured for processing a substrate utilizing source gas released from at least one gas jet into a substrate processing chamber of the substrate processing system. The substrate processing system includes a first gas port configured to introduce the gas jet into the substrate processing chamber and a directional blocking wall protruding above a plane formed by the opening of the first gas port. The directional blocking wall is disposed closer to a first portion of a circumference of the first gas port than a second portion of the circumference. The first portion of the circumference is configured to be disposed toward a given portion of the substrate processing chamber when the gas distribution plate is positioned within the substrate processing chamber such that the directional blocking wall is disposed between the gas jet and the given portion of the substrate processing chamber, thereby preferentially reducing the entrainment of the gas from the given portion of the substrate processing chamber into the gas jet when the gas jet is released into the substrate processing chamber.

21 Claims, 4 Drawing Sheets

TECHNIQUES FOR REDUCING PARTICULATE CONTAMINATION ON A SUBSTRATE DURING PROCESSING

BACKGROUND OF THE INVENTION

The present invention relates to the processing of substrates in a substrate processing chamber. More particularly, the present invention relates to improved apparatus and methods for reducing particle contamination in the processing of substrates in a substrate processing chamber.

In the fabrication of semiconductor-based products (e.g., integrated circuits or flat panel displays), the substrate (e.g., the semiconductor wafer or the glass panel) may be processed in multiple processing steps. Some of these processing steps, such as etching, deposition, stripping, ashing, and the like, may be performed in a substrate processing chamber utilizing any number of suitable source gases. The source gas may be introduced under pressure into the substrate processing chamber via one or more gas ports.

In the case of a plasma etching reactor, the etchant source gas molecules are excited to form a plasma to etch a substrate in the plasma processing chamber. The plasma reacts with the exposed areas of the substrate surface to remove materials from the exposed areas, forming etch byproducts in the process. The etch byproducts are then exhausted away from the plasma processing chamber to maintain the density of the reactive species at a desired level and to reduce the accumulation of particulate contaminants on interior surfaces of the plasma processing chamber as well as on the substrate itself. After processing is completed, a purge process may be performed to evacuate the chamber interior of any remaining etch byproducts, thereby preventing the particulate contaminants created during one process from contaminating subsequent processes.

As the density of semiconductor devices increases, it becomes increasingly important to minimize the introduction of particulate contaminants onto the surface of the wafer and/or chuck to ensure the integrity of the process and to increase yield. In the past, efforts to reduce particulate contaminants within the substrate processing chamber have included, for example, periodic cleaning of the chamber interior, selecting process parameters and source gases that produces fewer particulate contaminants, reducing the surface areas within the plasma processing chamber on which particulate contaminants can accumulate, and the like.

However, little if any attention has been paid to the design of the inlet gas ports and its role in contributing to the introduction of particulate contaminants onto the substrate surface. This is because inlet gas ports by their nature are intended to introduce uncontaminated source gas (i.e., a gas that is relatively free of particulate contaminants) into the substrate processing chamber. Thus one typically would not look at the inlet gas ports and particularly the behavior of the gas jets that emanate therefrom when trying to address the problem of particulate contamination on the substrate surface.

SUMMARY OF THE INVENTION

In one embodiment, the invention relates to a gas distribution mechanism designed to preferentially reduce entrainment of gas from a given portion of a substrate processing chamber into a gas jet released into the substrate processing chamber. The gas distribution mechanism includes a first gas port configured to introduce the gas jet and a directional blocking wall protruding above a plane formed by the opening of the first gas port. The directional blocking wall is disposed closer to a first portion of a circumference of the first gas port than a second portion of the circumference. The first portion of the circumference is configured to be disposed toward the given portion of the substrate processing chamber when the gas distribution plate is positioned within the substrate processing chamber such that the directional blocking wall is disposed between the gas jet and the given portion of the substrate processing chamber, thereby preferentially reducing the entrainment of the gas from the given portion of the substrate processing chamber into the gas jet when the gas jet is released into the substrate processing chamber.

The present invention relates, in another embodiment, to a method for reducing entrainment of gas from a first portion of a substrate processing chamber into a gas jet released from a gas port. The gas port is configured for introducing the gas jet into the substrate processing chamber. The method includes providing a gas distribution mechanism having therein the gas port. The gas distribution mechanism includes a directional blocking wall, which is configured to reduce entrainment of the gas from only a portion of a circumference of the gas port. The method also includes positioning the gas distribution mechanism within the substrate processing chamber such that the directional blocking wall is disposed toward the first portion of the substrate processing chamber, thereby preferentially reducing the entrainment of the gas from the first portion of the substrate into the gas jet when the gas jet is introduced into the substrate processing chamber by the gas port.

In yet another embodiment, the invention relates to a substrate processing system configured for processing a substrate utilizing source gas released from at least one gas jet into a substrate processing chamber of the substrate processing system. The substrate processing system includes a first gas port configured to introduce the gas jet into the substrate processing chamber and a directional blocking wall protruding above a plane formed by the opening of the first gas port. The directional blocking wall is disposed closer to a first portion of a circumference of the first gas port than a second portion of the circumference. The first portion of the circumference is configured to be disposed toward a given portion of the substrate processing chamber when the gas distribution plate is positioned within the substrate processing chamber such that the directional blocking wall is disposed between the gas jet and the given portion of the substrate processing chamber, thereby preferentially reducing the entrainment of the gas from the given portion of the substrate processing chamber into the gas jet when the gas jet is released into the substrate processing chamber.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, it is recognized that when a gas jet emanates from a gas port, the gas molecules exit therefrom at a relatively high velocity. The high velocity gas jet exerts a pulling force on gaseous and particulate molecules that are present in the regions surrounding the gas jet to cause them to be pulled into the gas jet itself. This phenomenon, referred to herein as the entrainment phenomenon, results in the introduction of particulate contaminants into the clean source gas that emanates from the inlet gas ports. Once the particulate molecules become part of the gas jets, some of the entrained particulate contaminants may be subsequently deposited back on the substrate surface, contributing to an increase in the density of particulate contaminants on the substrate surface.

Figure 1:
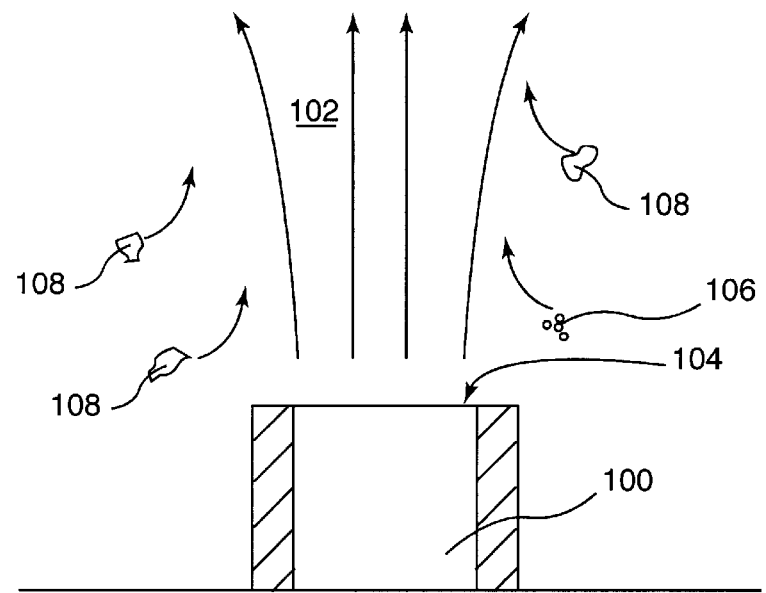
FIG. 1 depicts, to facilitate discussion of the entrainment phenomenon, a prior art gas port design.

To facilitate discussion, FIG. 1 depicts a cross sectional view of a gas port 100, representing a typical inlet gas port for introducing a source gas into the substrate processing chamber. Gas port 100 is coupled to a gas reservoir (not shown) through an appropriate gas feed line. The source gas is typically introduced under pressure and is ejected as a gas jet 102 out of a circular opening 104 of gas port 100 due to the pressure differential between the higher pressure within the gas feed line and the lower pressure within the substrate processing chamber. By way of example, in some low pressure high density plasma processing chambers, the pressure within the plasma processing chamber may be in the range of 2 to 90 milliTorr (mT), which is substantially lower than the pressure within the gas feed line. Thus the gas molecules emanating from opening 104 of gas port 100 may approach sonic speed as they exit from opening 104.

As gas jet 102 penetrates the interior of the substrate processing chamber, it expands in volume. However, gaseous and particulate molecules in the regions surrounding gas jet 102 are pulled into the gas jet as entrained matters. For illustration purposes, gaseous molecules 106 and particles 108 are shown entrained into gas jet 102 by the high speed molecules within gas jet 102. The entrained matters then become part of the source gas, get recirculated within the substrate processing chamber, and may be reintroduced onto the substrate surface to disadvantageously increase the density of particulate contaminants on the substrate surface.

With reference to FIG. 1, it should be noted that the entrainment phenomenon is more pronounced in the region where the speed of the escaping gas molecules is the greatest. Generally speaking, the gas molecules exiting opening 104 are at their greatest speed in the vicinity of opening 104 and gradually lose their velocity as they enter the chamber interior and as the gas jet expands in volume.

From this recognition, there is provided, in accordance with one aspect of the present invention, a gas distribution mechanism which is configured such that the entrainment of gaseous and particulate molecules surrounding the gas jet is reduced. Thus, fewer particulate contaminants are pulled into the gas jet and get redeposited back on the substrate surface during processing.

Figure 2:
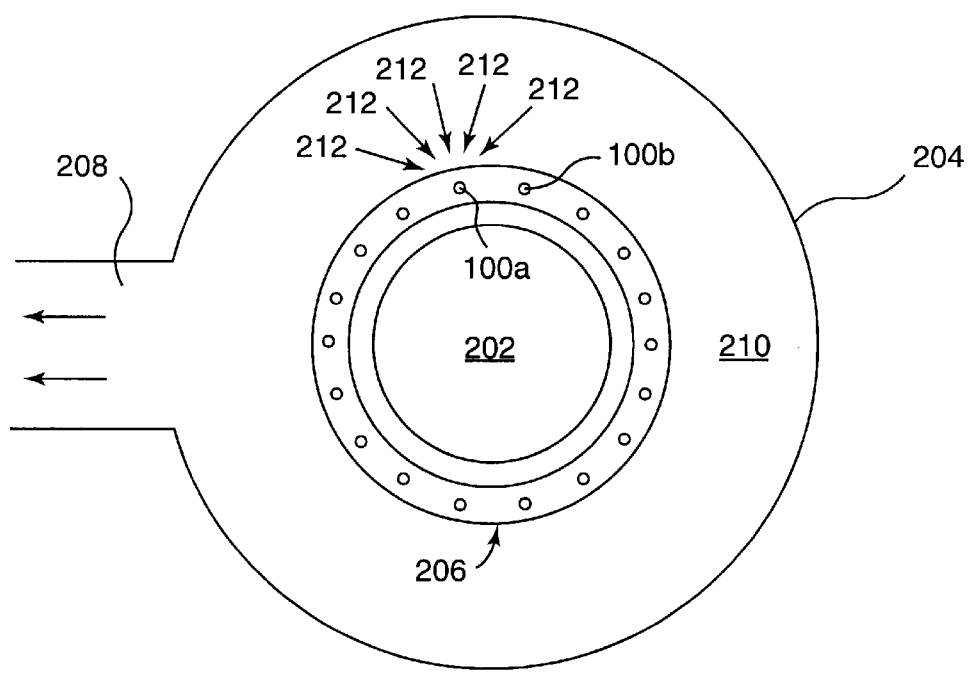
FIG. 2 depicts the design of a prior art gas distribution mechanism, including the gas ports, as it is disposed in a substrate processing chamber.

In accordance with one aspect of the present invention, the reduction in entrainment is preferential in certain directions around the gas port opening so that the reduction in the entrainment of gaseous and particulate molecules from regions of high particulate contaminant density is more pronounced. To facilitate the discussion of the application of one embodiment of the present invention in a substrate processing chamber, FIG. 2 is a top view depiction of an exemplary plasma processing chamber. The plasma processing chamber of FIG. 2 represents a typical substrate processing chamber wherein the entrainment phenomenon, if left uncorrected, may exacerbate the contamination problem on the surface of the substrate to be processed.

With reference to FIG. 2, a substrate 202 (which may be, for example, a semiconductor substrate) is shown disposed on a chuck within plasma processing chamber 204. A gas distribution mechanism 206, which has a ring configuration in the example of FIG. 2, is disposed around substrate 202. Gas distribution mechanism 206 includes a plurality of gas ports 100, which are configured to eject the source gas upwards as gas jets into the interior of the plasma processing chamber. Although gas distribution mechanism 206 represents a gas distribution ring that is disposed near and encircles the substrate in the example of FIG. 2, the gas distribution mechanism may also have other configurations such as a shower head configuration, a gas distribution plate configuration, or the like.

The ejected gas is then energized to form a plasma suitable for processing the surface of substrate 202. The by product gas, as well as any unused source gas, is then exhausted out of the chamber through exhaust manifold 208. In FIG. 2, exhaust manifold 208 is shown disposed along a sidewall of the chamber. However, the exhaust manifold port may be in the floor of the chamber itself to allow by product gas to be exhausted through exhaust ports in the chamber floor.

If particulate contaminants in the regions outside of gas distribution mechanism 206 (e.g., region 210 in FIG. 2) are entrained back into the inlet gas jets prior to being exhausted away from the chamber interior, such particulate contaminants may be redeposited back on the surface of substrate 202 to cause an increase in the density of particulate contaminants thereon. This is particularly true for particulate contaminants which may have flaked off the chamber walls during processing. Arrows 212 in FIG. 2 depict the paths described by the entrained molecules from region 210 as they are pulled back into the inlet gas jets.

In accordance with one embodiment of the present invention, the gas jet emanating from the gas port is converted from a free jet to a directionally walled jet to preferentially reduce, from certain directions about the gas port opening, the entrainment of matters from those directions. This conversion is accomplished, in one embodiment, by the use of a directional blocking wall proximate the gas port. With reference to FIG. 2, for example, the directional blocking wall functions to preferentially reduce the entrainment of matters from regions outside of the wafer (such as region 210 in FIG. 2) to prevent the reintroduction of these entrained particulate matters back on the surface of the wafer.

Figure 3A:
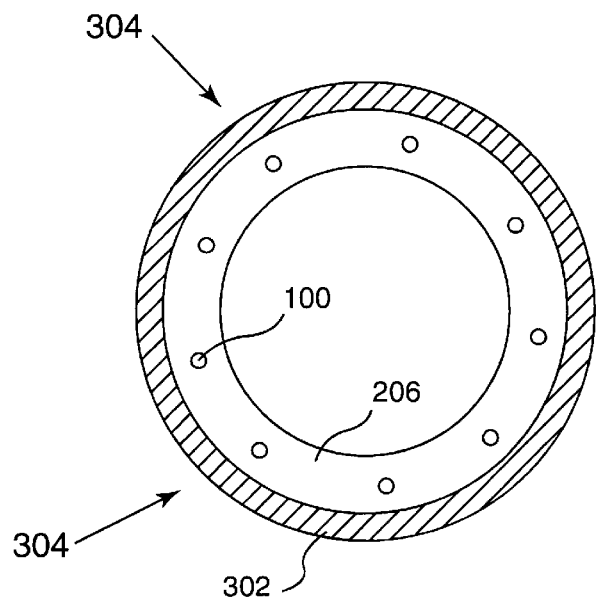
FIG. 3A illustrates, in accordance with one aspect of the present invention, a top view of an inventive gas distribution mechanism, including a directional blocking wall.
Figure 3B:
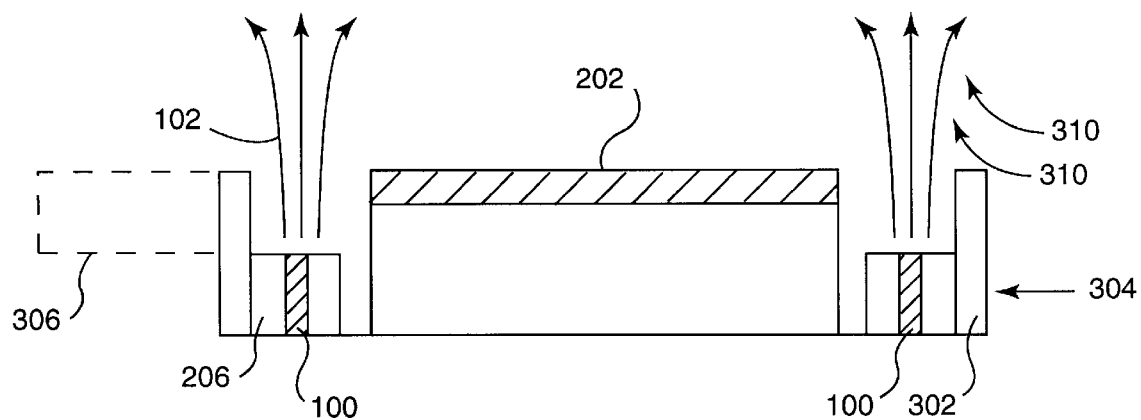
FIG. 3B illustrates a side view of the gas distribution mechanism of FIG. 3A.

With reference to the embodiments of FIGS. 3A and 3B, a gas distribution mechanism 206 is shown equipped with a directional blocking wall 302 to preferentially reduce the entrainment of matters that are present outside of the gas distribution mechanism. As shown in FIG. 3B, directional blocking wall 302 preferably protrudes above the plane formed by the opening of gas port 100 to achieve the preferential reduction of entrainment in the direction depicted by arrows 304. Directional blocking wall 302 preferably encircles the gas distribution mechanism. Alternatively, multiple directional blocking walls may be provided on the gas distribution mechanism, with one directional blocking wall for each gas port or group of gas ports.

The height of protruded portion 306 may be varied according to need. In general, protruded portion 306 should be high enough to sufficiently reduce entrainment in the region near the gas port opening where the velocity of the exiting gas molecules is the greatest. However, protruded portion 306 should not be unduly high so as to present excessively large surface areas on which an excessive amount of particulate contaminants may accumulate. If the gas distribution mechanism is disposed near the substrate, it is preferable to size the protruded portion such that sufficient clearance exists for convenient placement and removal of the substrate from the chuck during substrate transport.

Due to the presence of directional blocking wall 302, the entrainment of gaseous and particulate molecules from the region outside of gas distribution mechanism 206 (e.g., region 210 of FIG. 2) is reduced. This is advantageous since the regions outside of the gas distribution mechanism contain matters to be exhausted away and tend to have a higher density of particulate matters. Further, these regions, being proximate the chamber walls, are also likely to contain a higher density of particles that may have flaked off the chamber walls during processing.

Note that although some of the molecules (such as molecules 310) from the region outside of the gas distribution mechanism may be entrained into gas jet 102 in the region where the gas jet is no longer blocked by directional blocking wall 302, this entrainment occurs in the region of the gas jet where the gas velocity has slowed down somewhat. With a lower velocity, the entrainment phenomenon is, as mentioned earlier, less pronounced.

As seen in FIGS. 3A and 3B, directional blocking wall 302 is disposed between the gas jet and the region of plasma processing chamber 204 from which entrainment is particularly undesirable (e.g., region 210 of FIG. 2). The reduction in entrainment is said to be preferential since directional blocking wall 302, due to its position relative to the gas jets, is more effective at reducing entrainment from regions outside of gas distribution mechanism 206 than at reducing entrainment of molecules disposed toward the interior of gas distribution mechanism 206. In this manner, entrainment of molecules disposed near the substrate surface and inside of the directional blocking wall may continue unimpeded to facilitate efficient removal of byproducts from the substrate surface.

It is preferable that directional blocking wall 302 be placed outside of gas distribution mechanism 206 and away from substrate 202 to minimize the presence of surfaces near substrate 202 on which particulate contaminants can accumulate and flake off onto substrate 202. Placing directional blocking wall 302 toward the outside of gas distribution mechanism 206 instead of toward the inside (near substrate 202) also minimizes any effect directional blocking wall 302 may have on the uniformity of the process (due to, e.g., shadow effects).

In addition to reducing the density of particulate contaminant on substrate 202, the use of directional blocking wall 302 also increases the efficacy of the purging process that is employed to evacuate the chamber interior after a process is completed. The efficacy of the purging process is improved since the preferential reduction of entrainment of molecules from outside gas distribution mechanism 206 (i.e., from region 210) helps keeping the molecules in region 210 from being pulled back into the gas jets. With the use of directional blocking wall 302, more molecules are retained in region 210 to be exhausted away through exhaust manifold 208, thereby improving the efficacy of the purging process.

As mentioned, the particulate contamination problem on the substrate surface is alleviated by the addition of the directional blocking wall structure. This is counterintuitive since the addition of structures and interior surfaces inside the chamber is generally avoided by designers of plasma processing systems because it is well known that interior surfaces provide sites for particulate contaminants to attach to (and eventually flake off into the chamber interior). Nevertheless, this counterintuitive approach indeed reduces the level of particulate contaminants on the substrate surface.

Figure 4A:
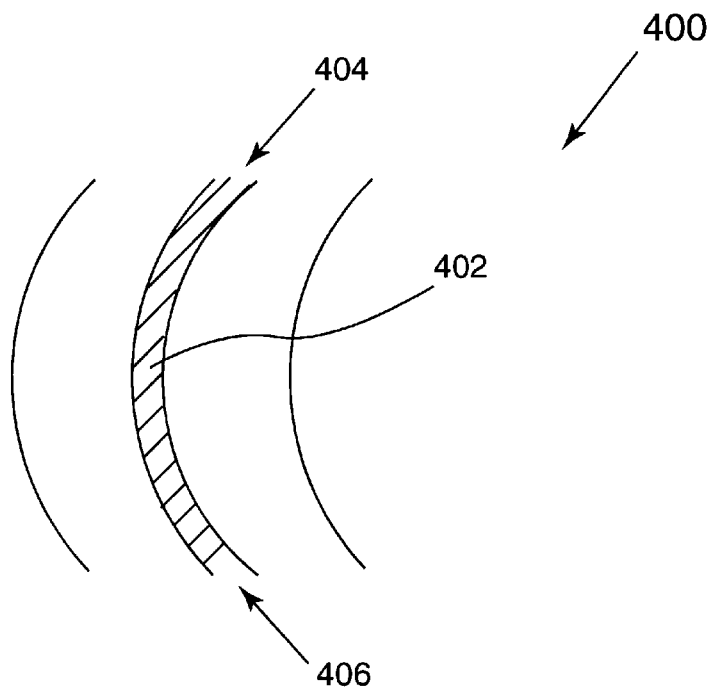
FIG. 4A illustrates, in accordance with one aspect of the present invention, another gas distribution mechanism, including a curved slit-shaped gas port.

In accordance with another aspect to the present invention, the gas ports that are employed to introduce the source gas into the chamber interior are modified in shape such that they are no longer round nozzles (as in the case of FIG. 2). As depicted in FIG. 4A, a gas port 402 is provided wherein the gas port opening has a curved slit shape. To simplify construction, a plurality of curved slit-shaped gas ports may be provided on the gas distribution mechanism around the substrate or a single curved slit-shape gas port may be formed to encircle the entire substrate. The slit shape of the gas port opening substantially reduces entrainment of foreign matters in the directions along the slit, i.e., in the directions of arrows 404 and 406 of FIG. 4A. In contrast, each round nozzle of FIG. 2 entrains matters from all directions surrounding the gas port opening. The use of a curved slit-shape gas ports in FIG. 4A advantageously reduces entrainment from at least some directions, thus producing slit gas jets that entrain fewer particulate contaminants into the source gas.

Figure 4B:
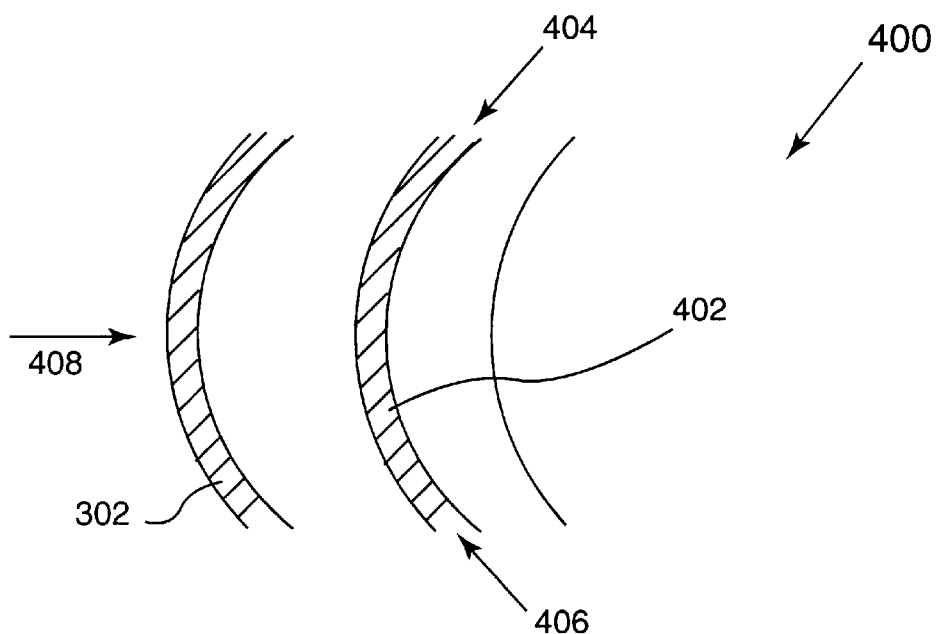
FIG. 4B illustrates, in accordance with one aspect of the present invention, another gas distribution mechanism, including a curved slit-shaped gas port and a directional blocking wall.

In accordance with another aspect of the invention, the curved slit-shape gas port of FIG. 4 may be combined with a directional blocking wall to further reduce the amount of entrained matters into the source gas. This embodiment is shown in FIG. 4B wherein curved slit-shape gas port 402 is employed in combination with directional blocking wall 302 in gas distribution mechanism 400. When so provided, entrainment is substantially reduced in the direction along the slit, e.g., in the direction of arrows 404 and 406, as well as from outside the gas distribution mechanism (e.g., from the direction of arrow 408).

Figure 5:
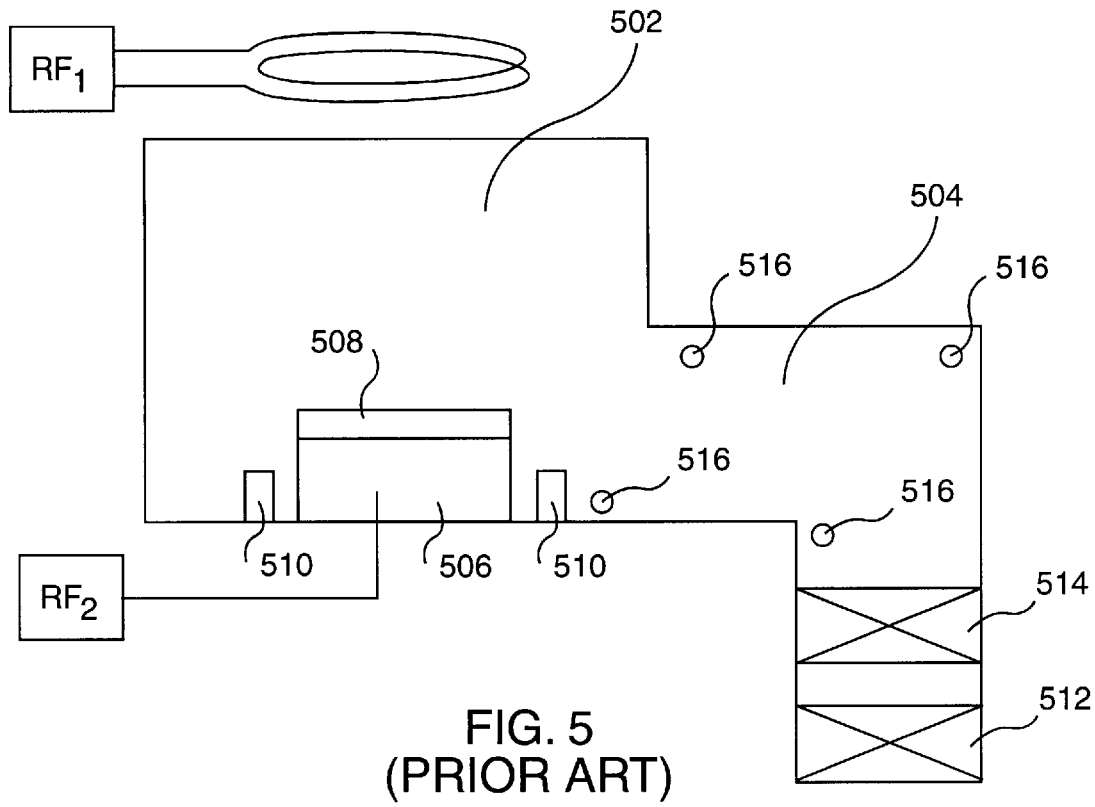
FIG. 5 depicts the design of an exemplary prior art exhaust manifold to facilitate discussion of the particulate contamination issue.

To further reduce the level of particulate contaminants in the substrate processing chamber, the exhaust manifold of the substrate processing chamber may be retrofitted or modified to enhance the laminate flow of the exhaust gas exiting the chamber through the exhaust manifold. To facilitate discussion, FIG. 5 illustrates a cut away view of a typical substrate processing chamber 502 and an exhaust manifold 504. For reference, chuck 506, substrate 508, and gas distribution mechanism 510 are shown disposed within substrate processing chamber 502. Exhaust gas is evacuated from substrate processing chamber 502 through exhaust manifold 504 by turbo pump 512 (acting in concert with valve 514).

In a typical system, there exists many dead spots which may be formed by sharp corners or protrusions, along the exhaust manifold. The dead spots tend to interrupt the laminate flow of gas exiting from chamber 502, causing particulate matters in the airflow to become separated from the flow and deposited along the sidewalls of the exhaust manifolds. Some exemplary dead spots in a typical exhaust manifold are depicted in FIG. 5 as dead spots 516.

To reduce the accumulation of particulate contaminants in the exhaust manifold, the presence of which may contribute to the increased density of particulate contaminants in the substrate processing chamber as some particulate contaminants may be swept back into the chamber during some portion of the processing cycle, the exhaust manifold may be formed with or retrofitted with surfaces that streamline the airflow to substantially reduce the dead spots and to ensure that the flow remains laminate and streamlined on its way to the turbo pump.

Figure 6:
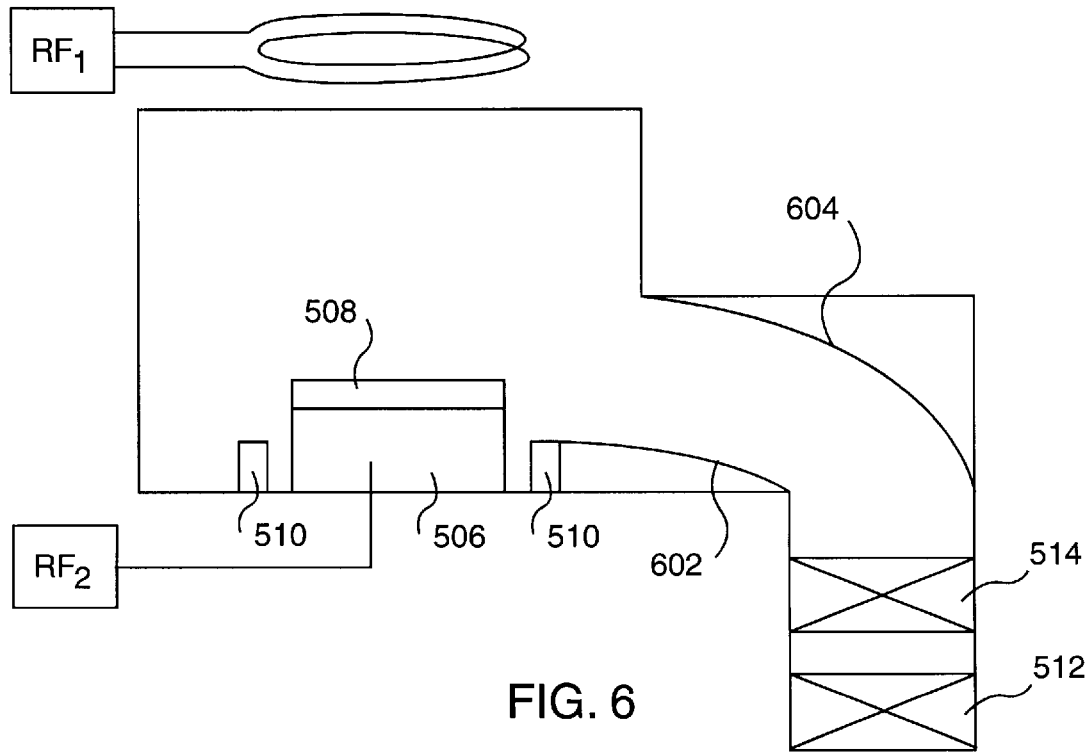
FIG. 6 illustrates the air flow streamlining panels that may be fitted into the exhaust manifold to decrease the level of particulate contamination within the chamber.

By way of example, FIG. 6 depicts panels 602 and 604, which may be provided to retrofit an existing manifold to streamline the exhaust airflow and reduce and/or eliminate the dead spots. Of course any number of airflow streamlining panels may be provided to improve the flow of the exhaust air through the exhaust manifold. Airflow streamlining panels may also be provided to streamline the airflow at the junction between the exhaust manifold and the chamber itself. It should be appreciated that the exact shape and size of each panel depends on the design of each substrate processing system. Nevertheless, the exact size and shape of an airflow streamlining surface in an exhaust manifold may be readily obtained by consulting with those familiar with the art of fluid dynamics.

In a nonobvious manner, the invention reduces the particulate contamination problem within the chamber, and more specifically on the substrate surface, by making modifications downstream of the area where the problem occurs, i.e., in the exhaust manifold which is a region of the substrate processing system from which gaseous and particulate matters are not expected to be flowed backward toward the chamber. However, it is recognized that although the exhaust manifold area is downstream relative to the chamber, particulate contaminants therein may at times be swept back into the chamber in certain portions of the processing, purging, cleaning, or substrate transport cycle, and the reduction of particulate contaminants on the walls of the exhaust manifold may alleviate the particulate contamination problem upstream in the chamber itself.

While this invention has been described in terms of several preferred embodiments, there are alterations, permutations, and equivalents which fall within the scope of this invention. By way of example, while the many embodiments have been discussed with reference to a plasma etch reactor, the invention may also be employed in other types of substrate processing chambers (including deposition, ashing, stripping, and the like), whether or not plasma is involved. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A gas distribution mechanism designed to preferentially reduce entrainment of gas from a given portion of a substrate processing chamber into a gas jet released into said substrate processing chamber, comprising:

a first gas port configured to introduce said gas jet;

a directional blocking wall protruding above a plane formed by the opening of said gas port, said directional blocking wall being disposed closer to a first portion of a circumference of said first gas port than a second portion of said circumference, said first portion of said circumference being configured to be disposed toward said given portion of said substrate processing chamber when said gas distribution mechanism is positioned within said substrate processing chamber such that said gas jet is disposed between said directional blocking wall and a substrate, said substrate being disposed within said substrate processing chamber for substrate processing, and such that said directional blocking wall is disposed between said gas jet and said given portion of said substrate processing chamber, thereby preferentially reducing said entrainment of said gas from said given portion of said substrate processing chamber into said gas jet when said gas jet is released into said substrate processing chamber.

2. The gas distribution mechanism of claim 1 further comprising a plurality of gas ports, said plurality of gas ports and said first gas port being arranged in a ring configuration to form a ring of gas ports.

3. The gas distribution mechanism of claim 2 wherein said directional blocking wall represents a circular wall encircling an outer periphery of said ring of gas ports.

4. The gas distribution mechanism of claim 3 wherein said ring of gas ports is configured to surround said substrate disposed within said substrate processing chamber for substrate processing.

5. The gas distribution mechanism of claim 1 wherein said directional blocking wall is disposed on a lip of said gas port.

6. The gas distribution mechanism of claim 1 wherein said directional blocking wall is in a spaced-apart relationship relative to said opening of said first gas port.

7. The gas distribution mechanism of claim 1 wherein said substrate processing chamber represents a low pressure plasma processing chamber.

8. A gas distribution mechanism designed to preferentially reduce entrainment of gas from a given portion of a substrate processing chamber into a gas jet released into said substrate processing chamber, comprising:

a first curved slit-shaped gas port, said first gas port having a curved slit-shaped opening, said first gas port being disposed such that an outer curve of said first curved slit-shaped gas port is disposed toward said given portion of said substrate processing chamber, an inner curve of said first curved slit-shaped gas port being disposed toward a substrate to be processed within said substrate processing chamber, said first curved shaped gas port being configured to introduce said gas jet through said curved slit-shaped opening into said substrate processing chamber.

9. The gas distribution mechanism of claim 8 wherein said first curved slit-shaped gas port has a circular configuration to completely encircle said substrate during substrate processing.

10. The gas distribution mechanism of claim 8 further comprising a plurality of curved slit-shaped gas ports, said plurality of curved slit-shaped gas ports and said first curved slit-shaped gas ports being arranged around said substrate in a spaced-apart relationship relative to said substrate.

11. The gas distribution mechanism of claim 8 wherein said substrate represents a semiconductor wafer and said substrate processing chamber represents a plasma processing chamber.

12. The gas distribution mechanism of claim 11 wherein said plasma processing chamber represents a low pressure plasma processing chamber.

13. The gas distribution mechanism of claim 8 further comprising a directional blocking wall protruding above a plane formed by said opening of said first curved slit-shaped gas port, said directional blocking wall being disposed closer to said outer curve than said inner curve such that said directional blocking wall is disposed between said gas jet and said given portion of said substrate processing chamber during substrate processing, thereby preferentially reducing said entrainment of said gas from said given portion of said substrate processing chamber into said gas jet when said gas jet is released into said substrate processing chamber.

14. The gas distribution mechanism of claim 13 further comprising a plurality of curved slit-shaped gas ports, said plurality of curved slit-shaped gas ports and said first curved slit-shaped gas port being arranged around said substrate, said directional blocking wall representing a contiguous ring encircling said plurality of curved slit-shaped gas ports and said first curved slit-shaped gas port.

15. A substrate processing system configured for processing a substrate utilizing source gas released from at least one gas jet into a substrate processing chamber of said substrate processing system, comprising:

a first gas port configured to introduce said gas jet into said substrate processing chamber;

a directional blocking wall protruding above a plane formed by the opening of said first gas port, said directional blocking wall being disposed closer to a first portion of a circumference of said first gas port than a second portion of said circumference, said first portion of said circumference being configured to be disposed toward a given portion of said substrate processing chamber such that said gas jet is disposed between said directional blocking wall and a substrate, said substrate being disposed within said substrate processing chamber for substrate processing, and such that said directional blocking wall is disposed between said gas jet and said given portion of said substrate processing chamber, thereby preferentially reducing said entrainment of said gas from said given portion of said substrate processing chamber into said gas jet when said gas jet is released into said substrate processing chamber.

16. The substrate processing system of claim 15 further comprising a plurality of gas ports, said plurality of gas ports and said first gas port being arranged in a ring configuration to form a ring of gas ports.

17. The substrate processing system of claim 16 wherein said directional blocking wall represents a circular wall encircling an outer periphery of said ring of gas ports.

18. The substrate processing system of claim 17 wherein said ring of gas ports is configured to surround said substrate disposed within said substrate processing chamber for substrate processing.

19. The substrate processing system of claim 15 wherein said directional blocking wall is disposed on a lip of said gas port.

20. The substrate processing system of claim 15 wherein said directional blocking wall is in a spaced-apart relationship relative to said opening of said first gas port.

21. The substrate processing system of claim 15 wherein said substrate processing mechanism represents a low pressure plasma processing chamber.

* * * * *